United States Patent [19]
Wustlich

[11] Patent Number: 5,367,441
[45] Date of Patent: Nov. 22, 1994

[54] ILLUMINATING DEVICE FOR ILLUMINATING BACKGROUND SURFACES

[75] Inventor: Hans-Dieter Wustlich, Rheinberg, Germany

[73] Assignee: Wustlich Holding GmbH, Rheinberg, Germany

[21] Appl. No.: 17,865

[22] Filed: Feb. 16, 1993

[30] Foreign Application Priority Data

Mar. 19, 1992 [DE] Germany .................. 4208922

[51] Int. Cl.$^5$ ............................................. G09F 13/04
[52] U.S. Cl. ...................................... 362/97; 362/243; 362/249; 362/800
[58] Field of Search ............ 362/97, 98, 99, 243, 362/249, 800

[56] References Cited

U.S. PATENT DOCUMENTS

| | | | |
|---|---|---|---|
| 4,761,720 | 8/1988 | Solow | 362/800 X |
| 4,975,814 | 12/1990 | Schairer | 362/800 X |
| 5,140,220 | 8/1992 | Hasegawa | 362/800 X |

Primary Examiner—Stephen F. Husar
Attorney, Agent, or Firm—Robert W. Becker & Associates

[57] ABSTRACT

An illuminating device for illuminating a background surface of a surface display has a frame with inner reflecting surfaces. A circuit board with leads closes off the interior of the frame. The circuit board is made of a light-transmissive material and serves as the background surface to be illuminated. The circuit board comprises leads and light-emitting diode chips connected to the leads so as to be controllable. A scattering body in the form of a light-transmissive potting compound containing scattering centers is filled into the interior of the frame. The circuit board is preferably a circuit board with a cover layer of a non-light-transmissive material from which the coating of non-light-transmissive material has been removed by etching. The scattering centers are preferably in the form of glass particles.

6 Claims, 1 Drawing Sheet

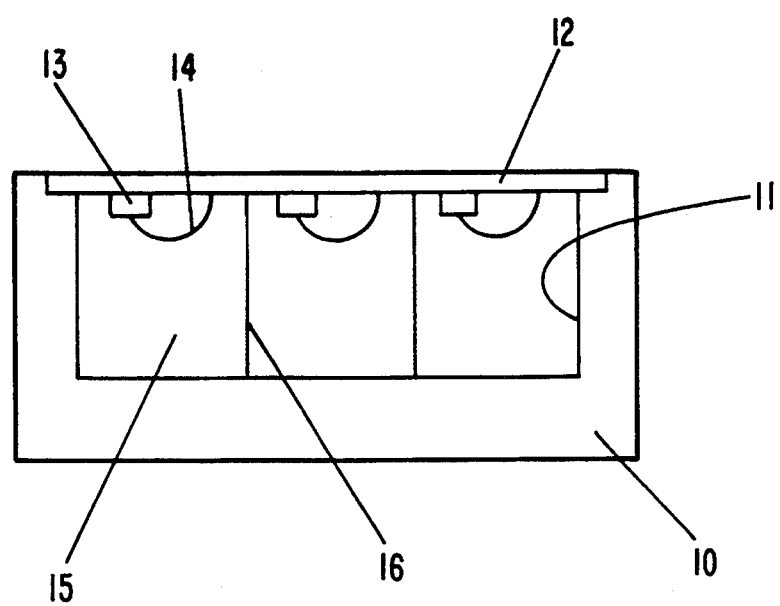

ILLUMINATING DEVICE FOR ILLUMINATING BACKGROUND SURFACES

BACKGROUND OF THE INVENTION

The present invention relates to an illuminating device for illuminating background surfaces, especially for surface displays comprising a circuit board, made of a light-transmissive material and covered with a non-light-transmissive material, and light-emitting diode chips arranged on the circuit board and controllable by leads, and further having a housing supporting the background surface to be illuminated, the housing having reflecting surfaces.

An illuminating device of the aforementioned kind is known from PCT application WO 90/13885. In one embodiment of the illuminating device disclosed therein a circuit board with light-emitting diode chips is supported on a plastic frame provided with reflecting surfaces. Opposite to the circuit board the background surface to be illuminated is arranged and is in the form of a diffuser film. The essentially light-transmissive circuit board is coated with a non-light-transmissive metal or other material with the exception of the leads and the light-emitting diode chips so that the light generated by the light-emitting diode chips is emitted only in the direction toward the background surface to be illuminated. With this known design it is said to be possible to produce illuminating devices of a total constructive height of only 2 mm to 3 mm.

However, the known illuminating device has the disadvantage that a further reduction of the constructive height is not possible because the required closer placement of the background surface to be illuminated and the arranged circuit board with the light-emitting diode chips prevents the diffusion and distribution of the emitted light of the light-emitting diode chips. The illumination of the background surface occurs essentially with a point focus with a visible transmission of the chip arrangement onto the background surface, which thus exhibits great light differences.

It is therefore an object of the present invention to provide an illuminating device of the aforementioned kind that is improved with respect to minimizing its constructive height and a uniform illumination of the background surface.

DESCRIPTION OF THE DRAWINGS

This object, and other objects and advantages of the present invention, will appear more clearly from the following specification in conjunction with the accompanying only drawing, in which the inventive illuminating device is schematically represented in a cross-sectional view.

SUMMARY OF THE INVENTION

The inventive illuminating device for illuminating a background surface of a surface display is primarily characterized by a frame having inner reflecting surfaces, a circuit board with leads, the circuit board made of a light-transmissive material and connected to the frame so as to form the background surface to be illuminated and close off the interior of the frame, the circuit board comprising leads and light-emitting diode chips connected to the leads so as to be controllable, and a scattering body in the form of a light-transmissive potting compound containing scattering centers and filled into the interior of the frame.

Preferably, the circuit board is a circuit board with a cover layer of a non-light-transmissive material from which circuit board the coating of non-light-transmissive material has been removed by etching.

Advantageously, the potting compound is a plastic material and the scattering centers are glass particles.

The frame further comprises stays for supporting the circuit board. Preferably, the stays are arranged in a net structure. Advantageously, the stays are made of fiber glass.

The basic concept of the present invention is that the light-transmissive circuit board itself can be used as the background surface to be illuminated and that the interior of the frame enclosed by the frame and the circuit board contains a scattering body made from a light-transmissive potting compound containing scattering centers. The invention has the advantage that a direct illumination of the background surface by the light-emitting diode chip is prevented. The illumination occurs only by the reflection of the light emitted from the light-emitting diode chips, which are arranged on the background surface to be illuminated, via the scattering body comprised of the potting compound and the reflecting surfaces of the frame enclosing the scattering body. Accordingly, a diffusion of the point-focused emitted light from the light-emitting diode chip occurs at the scattering centers in the potting compound. Inventively, the circuit board which is made of a light-transmissive material remains light-transmissive so that light reflected at the non-light-transmissive frame can exit via the circuit board providing the background surface to be illuminated. Leads and light-emitting diode chips arranged on the circuit board, i.e., background surface to be illuminated are so small that an optical disruption of the elimination effect of the circuit board, i.e., background surface is not observed.

With the inventive embodiment of the illuminating device it is advantageously possible to reach a total constructive height of an illuminating device of less than 1.5 mm. The inventive illuminating device provides an alternative to the so-called light-emitting films which due to their short service life, the required high operating voltage, and the comparably low light intensity are disadvantageous.

Commercially available circuit board are made of a light-transmissive base material, but are coated with a coating of non-light-transmissive material by the manufacturer. A preferred embodiment of the invention suggests to reinstate the light-transmissivity of the circuit board by removing the non-light-transmissive material in an etching step whereby the light-emitting diodes and the leads are excluded from the etching process.

In another embodiment of the invention the potting compound is comprised of a plastic material and has glass particles that serve as the scattering centers, whereby these glass particles can be in the form of filaments, woven material, or a mat that are introduced into the potting compound.

In another preferred embodiment of the present invention, the circuit board is supported by thin stays at the frame so that when a surface load acts on the circuit board, i.e., the background surface, of, for example, a thickness of 0.2 mm damage to the circuit board (collapse into the frame) is prevented. Preferably, the stays are distributed over the surface area of the circuit board in a net-structure so that in this manner a good support of the circuit board in connection with an overall stability of the illuminating device results. Due to the arrangement of the stays, a subdivision of the interior of the frame results whereby the individual sub-structures are filled with the potting compound so that scattering bodies are distributed over the area of the light-emitting diode chips. Preferably, the stays are made of fiberglass so as not to disturb or disrupt the diffusion and reflection of the light generated by the light-emitting diode chips.

DESCRIPTION OF PREFERRED EMBODIMENTS

The present invention will now be described in detail with the aid of a specific embodiment utilizing the only FIGURE.

The illuminating device has a U-shaped frame 10 made of a non-light transmissive material having inner reflecting surfaces 11 that are accordingly machined in order to improve the reflection effect. The open side of the frame 10 is closed off by a circuit board 12 comprised of a light-transmissive material having light-emitting diode chips 13 arranged on its inwardly oriented side. The light-emitting diode chips 13 are connected via respective wires 14 to the circuit board as is disclosed in PCT application WO 90/13885.

The interior 15 enclosed by the circuit board 12 and the U-shaped frame 10 is filled with a potting compound that may be comprised of, for example, an epoxy resin or a silicone compound. The potting compound contains fine glass particles as scattering centers.

The light emitted by the light-emitting diode chips 13, 14 is initially point-focused and is diffused by the potting compound contained within the interior 15 and reflected at the inner reflecting surfaces 11 of the U-shaped frame 10. Upon further diffusion by the potting compound the light is returned to the circuit board 12 which forms the background surface to be illuminated and by exiting the circuit board 12 illuminates the circuit board thereby providing the illuminated background surface.

Stays 16 provided in the interior 15 serve to support the circuit board 12 relative to the frame 10 so that with respect to the extension of the surface area of the surface display an overall stability of the illuminating device results. This stability is especially achieved when the stays 16 have a net-like structure extending over the surface area of the circuit board 12.

The present invention is, of course, in no way restricted to the specific disclosure of the specification and drawings, but also encompasses any modifications within the scope of the appended claims.

What I claim is:

1. An illuminating device for illuminating a background surface of a surface display, said illuminating device comprising:
    a frame having inner reflecting surfaces;
    a circuit board with leads, said circuit board made of a light-transmissive material and connected to said frame so as to form the background surface to be illuminated and close off the interior of said frame, said circuit board comprising leads and light-emitting diode chips connected to said leads so as to be controllable; and
    a scattering body in the form of a light-transmissive potting compound containing scattering centers and filled into said interior of said frame.

2. An illuminating device according to claim 1, wherein said circuit board is a circuit board with a cover layer of a non-light-transmissive material from which circuit board said coating of non-light-transmissive material has been removed by etching.

3. An illuminating device according to claim 1, wherein said potting compound is a plastic material and wherein said scattering centers are glass particles.

4. An illuminating device according to claim 1, wherein said frame further comprises stays for supporting said circuit board.

5. An illuminating device according to claim 4, wherein said stays are arranged in a net structure.

6. An illuminating device according to claim 4, wherein said stays are made of fiberglass.

* * * * *